United States Patent
Heo et al.

(10) Patent No.: US 9,450,141 B2
(45) Date of Patent: *Sep. 20, 2016

(54) METHOD FOR SEPARATING GROWTH SUBSTRATE, METHOD FOR LIGHT-EMITTING DIODE, AND LIGHT-EMITTING DIODE MANUFACTURED USING METHODS

(71) Applicant: Seoul Viosys Co., Ltd., Ansan-si (KR)

(72) Inventors: Jeong Hun Heo, Ansan-si (KR); Joo Won Choi, Ansan-si (KR); Choong Min Lee, Ansan-si (KR); Young Wug Kim, Ansan-si (KR); Su Jin Shin, Ansan-si (KR); Su Youn Hong, Ansan-si (KR)

(73) Assignee: SEOUL VIOSYS CO., LTD., Ansan-Si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/436,068

(22) PCT Filed: Aug. 1, 2013

(86) PCT No.: PCT/KR2013/006960
§ 371 (c)(1),
(2) Date: Apr. 15, 2015

(87) PCT Pub. No.: WO2014/061906
PCT Pub. Date: Apr. 24, 2014

(65) Prior Publication Data
US 2015/0318436 A1    Nov. 5, 2015

(30) Foreign Application Priority Data

Oct. 15, 2012  (KR) .................. 10-2012-0114128
Oct. 15, 2012  (KR) .................. 10-2012-0114129

(51) Int. Cl.
*H01L 33/00*  (2010.01)
*H01L 33/32*  (2010.01)
(Continued)

(52) U.S. Cl.
CPC ....... *H01L 33/0079* (2013.01); *H01L 33/0075* (2013.01); *H01L 33/0095* (2013.01);
(Continued)

(58) Field of Classification Search
CPC ........... H01L 33/0075; H01L 33/0079; H01L 33/002; H01L 33/12; H01L 33/20; H01L 33/32; H01L 33/46; H01L 2933/0025; H01L 33/0095; H01L 21/0243; H01L 21/02488; H01L 21/02494
USPC ....... 257/76, 79, 98, 431, E33.052, E33.055, 257/E33.059, E21.499, E21.569, E21.567, 257/E31.001; 438/27, 42, 46, 57, 458, 478, 438/692
See application file for complete search history.

(56) References Cited

U.S. PATENT DOCUMENTS 7,244,662 B2 * 7/2007 Kondo ............... H01L 21/2007
                                                        257/E21.122
7,846,759 B2 * 12/2010 Atwater, Jr. ........ H01L 31/0687
                                                        257/431
(Continued)

FOREIGN PATENT DOCUMENTS

JP    2012174902 A    9/2012
KR   1020080061697 A  7/2008
(Continued)

OTHER PUBLICATIONS

International Search Report from International Application No. PCT/KR2013/006960, Nov. 22, 2013, 3 pages.
(Continued)

*Primary Examiner* — Dao H Nguyen
(74) *Attorney, Agent, or Firm* — Perkins Coie LLP

(57) ABSTRACT

Disclosed are a method for separating a growth substrate, a method for manufacturing a light-emitting diode, and the light-emitting diode. The method for separating a growth substrate, according to one embodiment, comprises: preparing a growth substrate; forming a sacrificial layer and a mask pattern on the growth substrate; etching the sacrificial layer by using electrochemical etching (ECE); covering the mask pattern, and forming a plurality of nitride semiconductor stacking structures which are separated from each other by an element separation area; attaching a support substrate to the plurality of semiconductor stacking structures, wherein the support substrate has a plurality of through-holes connected to the element separation area; and separating the growth substrate from the nitride semiconductor stacking structures.

15 Claims, 14 Drawing Sheets

(51) Int. Cl.
*H01L 27/15* (2006.01)
*H01L 21/02* (2006.01)
*H01L 33/20* (2010.01)
*H01L 33/46* (2010.01)
*H01L 33/12* (2010.01)

(52) U.S. Cl.
CPC ............... *H01L33/20* (2013.01); *H01L 33/32* (2013.01); *H01L 33/46* (2013.01); *H01L 33/12* (2013.01); *H01L 2933/0025* (2013.01)

(56) References Cited

U.S. PATENT DOCUMENTS

| | | | | |
|---|---|---|---|---|
| 7,927,971 | B2 * | 4/2011 | Tamura | .................... H01L 21/84 257/635 |
| 9,263,255 | B2 * | 2/2016 | Heo | .................... H01L 33/0079 |
| 2010/0202039 | A1 | 8/2010 | Kogut et al. | |
| 2012/0295376 | A1 * | 11/2012 | Lee | ..................... A61N 5/0622 438/28 |
| 2015/0311384 | A1 * | 10/2015 | Heo | ........................ H01L 33/62 438/400 |

FOREIGN PATENT DOCUMENTS

| | | |
|---|---|---|
| KR | 1020090125677 A | 12/2009 |
| KR | 1020110111209 A | 10/2011 |
| TW | 201210067 | 3/2012 |
| TW | 201218412 | 5/2012 |

OTHER PUBLICATIONS

Taiwan Intellectual Property Office, Taiwan Application No. 10520241320, Office Action, Mar. 1, 2016, 5 pages.

\* cited by examiner

Fig. 7
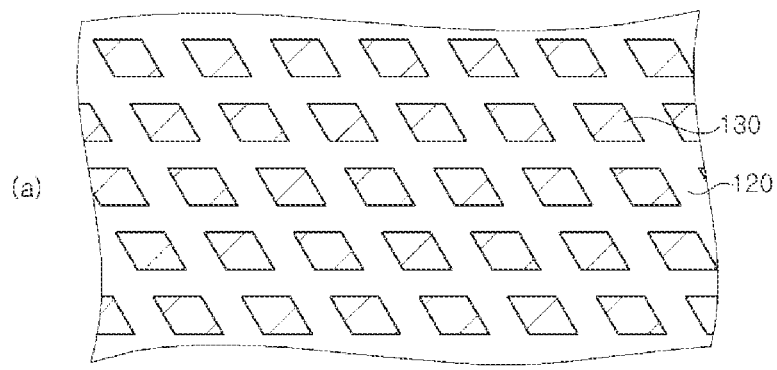
(a)
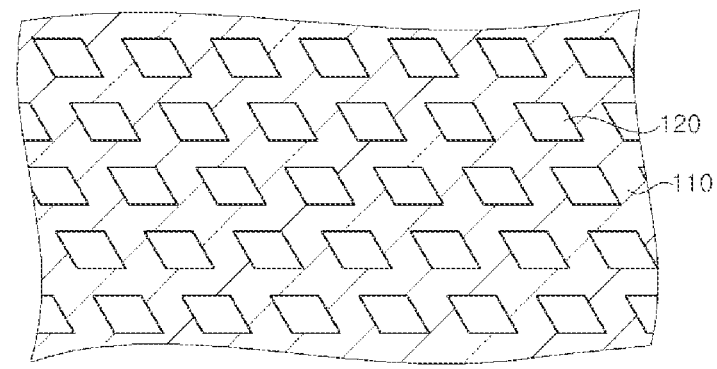
(b)
Fig. 8
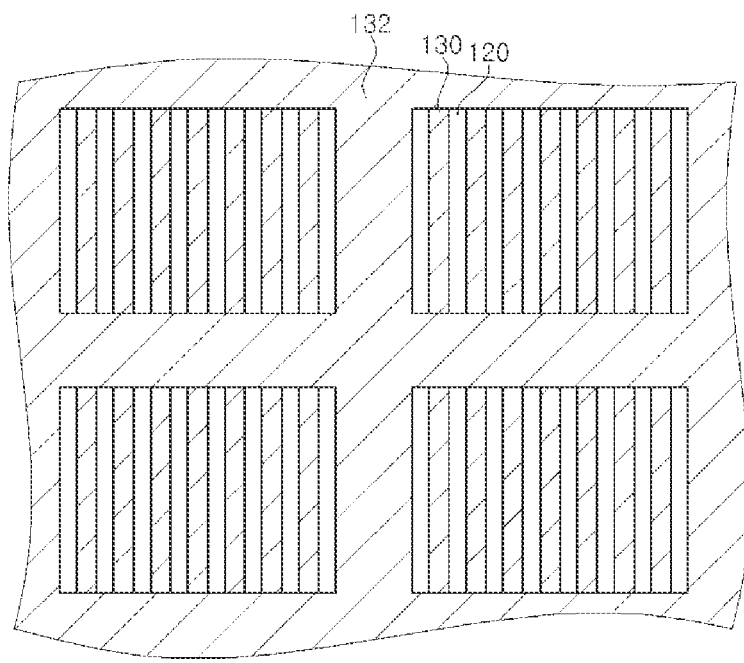

US 9,450,141 B2

METHOD FOR SEPARATING GROWTH SUBSTRATE, METHOD FOR LIGHT-EMITTING DIODE, AND LIGHT-EMITTING DIODE MANUFACTURED USING METHODS

CROSS REFERENCE TO RELATED APPLICATION

This patent document is a 35 U.S.C. 371 National Stage application of and claims priority and benefits to PCT Application No. PCT/KR2013/006960, filed on Aug. 1, 2013, which further claims the benefits and priorities of prior Korean Patent Application No. 10-2012-0114128, filed on Oct. 15, 2012, and prior Korean Patent Application No. 10-2012-0114129, filed on Oct. 15, 2012. The entire disclosures of the above applications are incorporated by reference in their entirety as part of this document.

TECHNICAL FIELD

The present invention relates to a method of separating a growth substrate from an epitaxial layer, a method of fabricating a light emitting diode, and a light emitting diode fabricated by the same.

BACKGROUND ART

Light emitting diodes are inorganic semiconductor devices that emit light, and have features such as eco-friendliness, low voltage, long lifespan, low price, and the like. Although light emitting diodes have generally been applied to lamps or devices for displaying simple information such as numerals, light emitting diodes have also recently been used in various fields including displays, automobile head lamps, projectors, and the like, with the development of technology, particularly, information display and semiconductor technologies.

Conventionally, a lateral light emitting diode (lateral LED) is fabricated by sequentially growing a plurality of semiconductor layers including an n-type semiconductor layer, an active layer and a p-type semiconductor layer on a growth substrate, followed by partially etching the p-type semiconductor layer and the active layer to form an n-type electrode and to form a p-type electrode on the p-type semiconductor layer.

In such a method, although the lateral light emitting diode can be relatively easily fabricated, such a light emitting diode has a reduced light emitting area due to removal of part of the active layer. In addition, the use of the growth substrate having low thermal conductivity, such as a sapphire substrate, results in increase in junction temperature due to heat generated by the light emitting diode, thereby causing deterioration in internal quantum efficiency.

To solve such problems of the lateral light emitting diode, a variety of vertical light emitting diodes have been developed. In vertical type light emitting diodes, since a sapphire substrate is removed by laser lift-off (LLO), it is possible to prevent deterioration in efficiency due to heat.

However, high intensity laser beams cannot be used in fabrication of vertical light emitting diodes since the semiconductor layer can suffer from cracking. Furthermore, when a substrate formed of the same material as that of a nitride semiconductor layer, for example, a gallium nitride substrate, is used as the growth substrate, it is difficult to use the laser lift-off process due to small difference in energy band gap between the gallium nitride substrate and the nitride semiconductor layer.

DISCLOSURE

Technical Problem

Exemplary embodiments of the present invention provide a method of separating a growth substrate, which enables more efficient and simple separation of the growth substrate at low cost while reducing loss of a nitride semiconductor layer, and a method of fabricating a light emitting diode.

Exemplary embodiments of the present invention provide a method of separating a growth substrate, which can reduce time for separation of a large growth substrate, and a method of fabricating a light emitting diode.

Exemplary embodiments of the present invention provide a light emitting diode fabricated using the method of fabricating a light emitting diode.

Other features and advantages of the present invention will be apparent from the following detailed description of the invention.

Technical Solution

In accordance with an aspect of the present invention, a method of separating a growth substrate includes: preparing a growth substrate; forming a sacrificial layer and a mask pattern on the growth substrate, wherein the sacrificial layer is exposed through an opening of the mask pattern; etching the sacrificial layer via an electrochemical etching (ECE); forming a plurality of nitride semiconductor stack structures isolated from each other by device isolation regions while covering the mask pattern; attaching a support substrate to the plurality of nitride semiconductor stack structures, the support substrate having a plurality of through-holes connected to the device isolation regions; and separating the growth substrate from the nitride semiconductor stack structures.

Since the sacrificial layer is etched by the electrochemical etching before forming the semiconductor stack structures, the growth substrate can be physically or chemically separated from the nitride semiconductor stack structures using stress or an etching solution. As a result, the growth substrate, even a large growth substrate, can be separated from the nitride semiconductor stack structures without damage thereto. In particular, since the etching solution can easily penetrate the device isolation regions via the through-holes of the support substrate, the growth substrate can be rapidly separated from the semiconductor stack structures using the etching solution.

Further, since the sacrificial layer is used, the growth substrate can be easily separated from the semiconductor stack structures even when the growth substrate is formed of the same material as that of the gallium nitride substrate.

In some embodiments, the sacrificial layer may be formed on the growth substrate, and the mask pattern may be formed on the sacrificial layer. However, it should be noted that the present invention is not limited thereto. For example, the sacrificial layer may be formed within the opening of the mask pattern after the mask pattern is first formed.

In addition, the sacrificial layer may be partially etched by application of voltage in at least two stages, wherein a voltage applied in a first stage is lower than a voltage applied in a second stage. As a result, relatively small micro pores are formed on the surface of the sacrificial layer and relatively large micro pores are formed inside the sacrificial layer, so that the surface of the sacrificial layer maintains relatively good crystallinity.

Further, formation of the plurality of nitride semiconductor stack structures isolated from each other includes growing the nitride semiconductor stack structures using the sacrificial layer as a seed to cover the mask pattern. In addition, during formation of the semiconductor stack structures, voids may be formed in the sacrificial layer. The voids may be formed during growth of the nitride semiconductor layers at high temperature.

In some embodiments, formation of the plurality of nitride semiconductor stack structures isolated from each other may further include forming device isolation regions by patterning the nitride semiconductor stack structures grown thereon.

In other embodiments, the device isolation regions may be formed by forming an isolation mask for dividing the mask pattern into a plurality of regions and growing the nitride semiconductor stack structures to be isolated from each other on the isolation mask.

Use of the isolation mask permits elimination of patterning processes for formation of the device isolation regions, that is, photolithography and etching, thereby enabling further process simplification.

On the other hand, each of the plural nitride semiconductor stack structures isolated from each other may have a rectangular shape in top view, and the through-holes of the support substrate may be aligned adjacent four corners of each of the nitride semiconductor stack structures.

In addition, the through-holes of the support substrate may have a size to be placed within the device isolation region and may be aligned in the device isolation region.

The growth substrate may be separated from the semiconductor stack structures by application of stress or by chemical etching. In particular, the growth substrate may be separated from the semiconductor stack structures by chemical etching using NaOH, BOE or HF.

In one embodiment, the mask pattern may be a convex pattern in which mask regions have a specific shape, for example, a stripe shape, a rhombus shape, or a hexagonal shape. In another embodiment, the mask pattern may be a concave pattern in which openings have a specific shape, for example, a rhombus shape or a hexagonal shape.

The method may further include forming a reflective metal layer, a barrier metal layer and a bonding metal layer on the semiconductor stack structures before attaching the support substrate. In addition, the bonding metal layer may surround the reflective metal layer and the barrier metal layer. As a result, prevention of exposure of the reflective metal layer or the barrier metal layer to the etching solution during chemical etching is possible.

In accordance with another aspect of the present invention, a method of fabricating a light emitting diode is disclosed. This method includes the method of separating a growth substrate as described above. In accordance with a further aspect of the present invention, a light emitting diode fabricated by the method of separating a growth substrate described above is disclosed.

In accordance with yet another aspect of the invention, a light emitting diode includes a support substrate; a semiconductor stack structure placed on the support substrate and including an active layer; and a periodic convex-concave pattern formed on an upper surface of the semiconductor stack structure. Here, the support substrate has a depression near a corner thereof.

Further, the support substrate may have a rectangular shape in top view and a depression formed at each of four corners of the support substrate. The semiconductor stack structure may have a narrower width than that of the support substrate, and may be placed inside the depressions.

Further, the light emitting diode may have a rough surface on each of concave portions and convex portions in the periodic concave-convex pattern.

In accordance with yet another embodiment, a method of separating a growth substrate includes: preparing a growth substrate; forming a mask pattern on the growth substrate; selectively growing a sacrificial layer of a nitride semiconductor on the growth substrate such that at least a portion of an upper area of each mask of the mask pattern is exposed; etching at least a portion of the sacrificial layer via an electrochemical etching (ECE); forming a nitride semiconductor stack structure covering the mask pattern; and separating the growth substrate from the nitride semiconductor stack structure.

Since the sacrificial layer is etched by the electrochemical etching before forming the semiconductor stack structure, the growth substrate can be physically or chemically separated from the nitride semiconductor stack structure using stress or an etching solution. As a result, the growth substrate, even a large growth substrate, can be separated from the nitride semiconductor stack structure without damage thereto.

Further, since the sacrificial layer is used, the growth substrate can be easily separated from the semiconductor stack structure even when the growth substrate is formed of the same material as that of the gallium nitride substrate.

Further, since it is possible to allow the etching solution to easily penetrate the sacrificial layer by adjusting the thickness of the sacrificial layer while the sacrificial layer is selectively grown, the growth substrate can be rapidly separated from the semiconductor stack structures upon chemical etching.

In some embodiments, the method of separating a growth substrate may further include forming a lower nitride layer on the growth substrate before forming the mask pattern, and forming a recess by etching the lower nitride layer using the mask pattern as an etching mask. The sacrificial layer may fill the recess. In addition, the sacrificial layer may be doped with a higher density of impurities than the lower nitride layer. Thus, during electrochemical etching, the sacrificial layer is at least partially etched, and the lower nitride layer remains.

In addition, the sacrificial layer may be partially etched by application of voltage in at least two stages, wherein a voltage applied in a first stage is lower than a voltage applied in a second stage. As a result, relatively small micro pores are formed on the surface of the sacrificial layer and relatively large micro pores are formed inside the sacrificial layer, so that the surface of the sacrificial layer maintains relatively good crystallinity. Further, the semiconductor stack structure may be grown on the sacrificial layer used as a seed. Furthermore, voids may be formed in the sacrificial layer, during formation of the semiconductor stack structure. The voids may be formed during growth of the nitride semiconductor layers at high temperature.

The method of separating a growth substrate may further include forming an upper nitride layer covering the mask pattern. Here, the sacrificial layer may be doped with a higher density of impurities than the upper nitride layer. After the upper nitride layer is formed, the sacrificial layer is etched to form the voids by the electrochemical etching. Further, the nitride semiconductor stack structure is formed on the upper nitride layer.

Here, electrochemical etching may be performed by applying a voltage of 50V to 65V in an oxalic acid (for example, 0.3 M) solution. As a result, most of the sacrificial layer is etched to form voids in the recess.

Here, the upper nitride layer may be formed to cover the sacrificial layer. In another embodiment, the upper nitride layer may cover the masks exposed through the sacrificial layer and may be formed to expose the sacrificial layer.

In some embodiments, the method of separating a growth substrate may further include forming an upper nitride layer covering the mask pattern. Here, the sacrificial layer may be doped with a higher density of impurities than the upper nitride layer. After the upper nitride layer is formed, the sacrificial layer is etched to form the voids via electrochemical etching. Further, the nitride semiconductor stack structure is formed on the upper nitride layer. Here, the mask pattern may be directly formed on the growth substrate.

The growth substrate may be separated from the semiconductor stack structure by application of stress or by chemical etching. For example, the growth substrate may be separated from the semiconductor stack structure by chemical etching using NaOH, BOE or HF.

In particular embodiments, the method of separating a growth substrate may further include forming device isolation regions by patterning the semiconductor stack structure before separating the growth substrate. As a result, when the growth substrate is separated by chemical etching, the etching solution can efficiently penetrate the device isolation regions, thereby enabling reduction of time for separation of the growth substrate.

The method of separating a growth substrate may further include attaching a support substrate to the semiconductor stack structure on which the device isolation regions is formed, before separation of the growth substrate. The method may further include forming a reflective metal layer, a barrier metal layer and a bonding metal layer on the semiconductor stack structure before attaching the support substrate.

In addition, the bonding metal layer may surround the reflective metal layer and the barrier metal layer. As a result, it is possible to prevent the reflective metal layer or the barrier metal layer from being exposed to the etching solution during chemical etching.

In some embodiments, the support substrate may have through-holes through which an etching solution can pass. The through-holes may have a size to be placed within the device isolation regions and may be aligned in the device isolation region.

Since the etching solution passes through the through-holes, it is possible to achieve further reduction of time for separation of the growth substrate.

In accordance with yet another aspect of the present invention, a method of fabricating a light emitting diode is disclosed. This method includes the method of separating a growth substrate as described above. In accordance with yet another aspect of the present invention, a light emitting diode fabricated by the method of separating a growth substrate described above is disclosed.

In accordance with yet another aspect of the invention, a light emitting diode includes a support substrate; a semiconductor stack structure placed on the support substrate and including an active layer; a convex-concave pattern formed on an upper surface of the semiconductor stack structure; and an electrode formed on a portion of the convex-concave pattern.

In accordance with yet another aspect of the invention, a method of fabricating a light emitting diode may include: preparing a growth substrate including a pattern; forming a sacrificial layer and a mask pattern on the growth substrate such that the sacrificial layer is exposed through an opening of the mask pattern; etching the sacrificial layer to form a first void; forming a nitride semiconductor stack structure covering the mask pattern; and separating the growth substrate from the nitride semiconductor stack structure.

Advantageous Effects

According to embodiments of the present invention, since the growth substrate can be separated by application of stress or chemical etching instead of using a laser, the growth substrate can be more efficiently simply separated at low cost without damage to nitride semiconductor layers. In addition, the method of separating a growth substrate allows more efficient infiltration of an etching solution, thereby enabling reduction of time for separation of a large growth substrate.

DESCRIPTION OF DRAWINGS

FIG. 5 to FIG. 7 are plan views of mask patterns in accordance with embodiments of the present invention.

FIG. 8 and FIG. 9 show a plan view and sectional views illustrating a method of separating a growth substrate and a method of fabricating a light emitting diode in accordance with another embodiment of the present invention.

Figure 1:
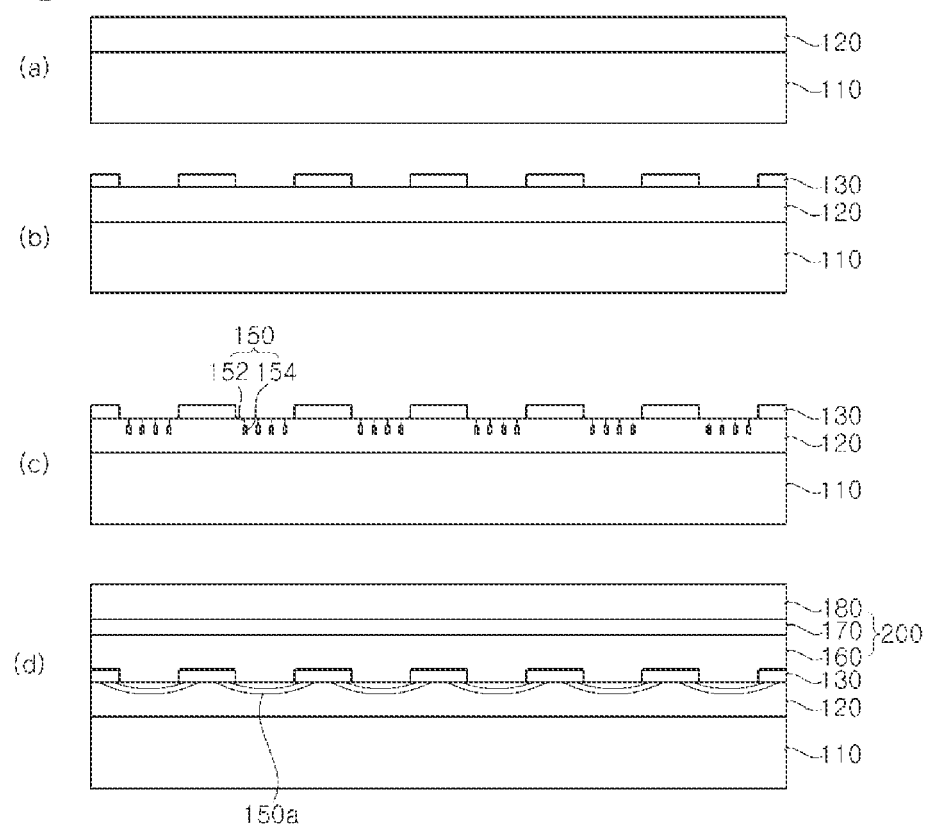
FIG. 1 to FIG. 3 show sectional views illustrating a method of separating a growth substrate and a method of fabricating a light emitting diode in accordance with one embodiment of the present invention.

| (Description of reference numerals) | |
|---|---|
| 110: Growth substrate | 120, 140, 144: Sacrificial layer |
| 125: Lower nitride layer | 130: Mask pattern |
| 142, 146: Upper nitride layer | 150: Micro pores |

(Description of reference numerals)

| | |
|---|---|
| 160: First nitride semiconductor layer | 170: Active layer |
| 180: Second nitride semiconductor layer | 190: Metal layer |
| 200: Nitride semiconductor stack structure | 210: Support substrate |
| 220: Electrode | |

BEST MODE

Embodiments of the present invention will be described in more detail with reference to the accompanying drawings. It should be understood that the following embodiments are given by way of illustration only to provide thorough understanding of the invention to those skilled in the art. Therefore, the present invention is not limited to the following embodiments and may be embodied in different ways. Further, like components will be denoted by like reference numerals throughout the specification, and the widths, lengths, and thicknesses of certain elements, layers or features may be exaggerated for clarity.

The embodiments of the invention disclose technology for separation of a growth substrate from nitride semiconductor layers after growing the nitride semiconductor layers on the growth substrate. In particular, the embodiments of the invention disclose various techniques for separating the growth substrate by application of stress or chemical etching using an etching solution instead of a typical laser lift-off process known in the art.

Figure 2:
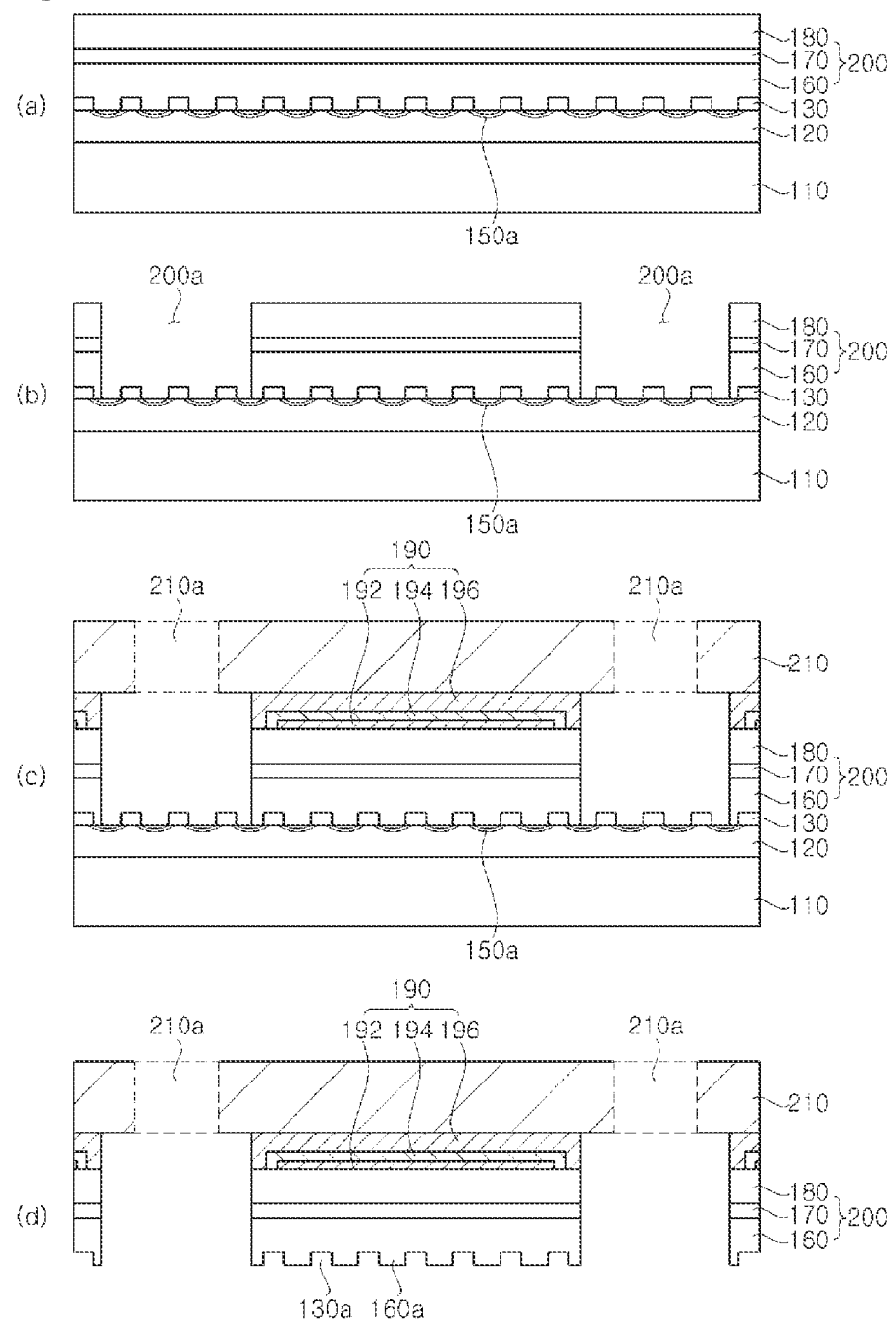
Figure 3:
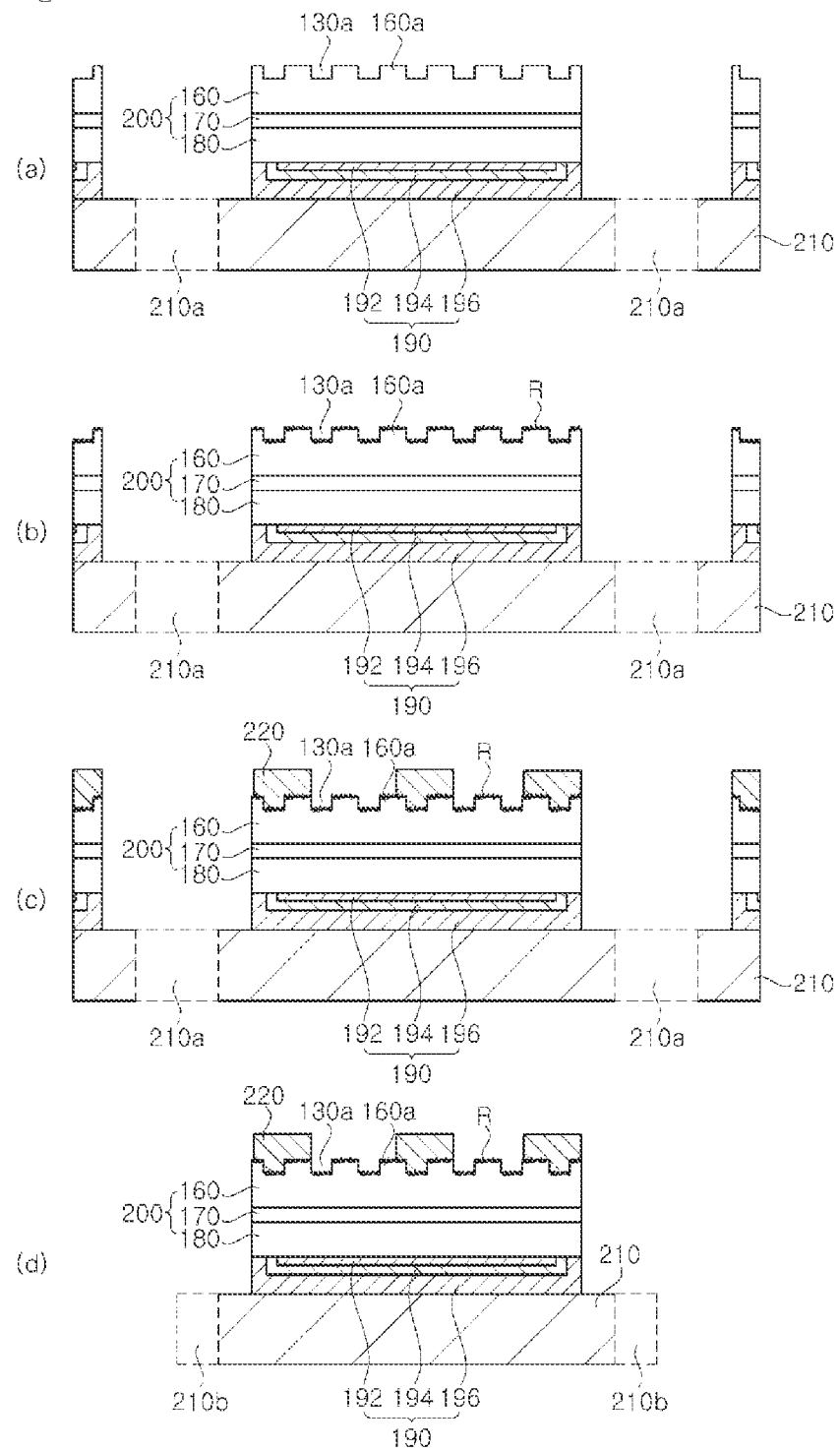

FIG. 1 to FIG. 3 show sectional views illustrating a method of separating a growth substrate and a method of fabricating a light emitting diode in accordance with one embodiment of the present invention.

First, referring to FIG. 1(a), a growth substrate 110 is prepared. The growth substrate 110 may be a sapphire substrate, GaN substrate, silicon carbide (SiC) substrate, or silicon (Si) substrate. Particularly, the growth substrate 110 may be a sapphire substrate or a GaN substrate.

A sacrificial layer 120 is formed on the growth substrate 110. The sacrificial layer 120 may be formed on the growth substrate 110 by, for example, metal-organic chemical vapor deposition (MOCVD) or molecular beam epitaxy (MBE). The sacrificial layer 120 may be a gallium nitride layer doped with a relatively high density of impurities, for example, a Si-doped GaN layer, which is doped with 3E18/$cm^3$ or more of Si. Nitride semiconductor layers described below may also be grown together with the sacrificial layer 120 by MOCVD or MBE, and a detailed description thereof will be omitted.

Figure 5:
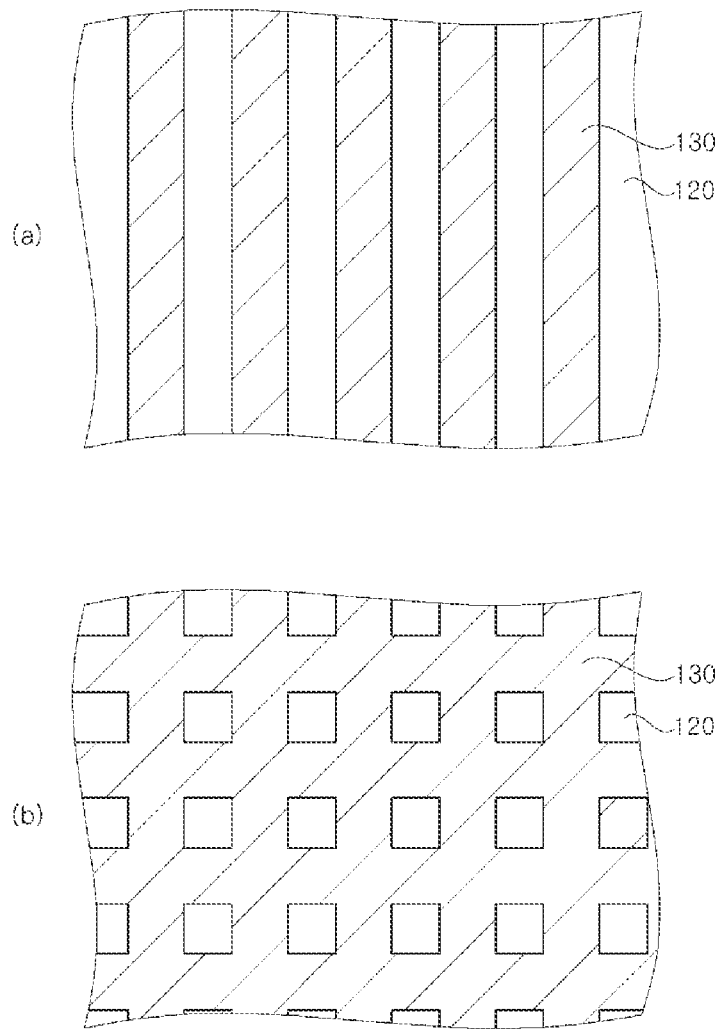
Figure 6:
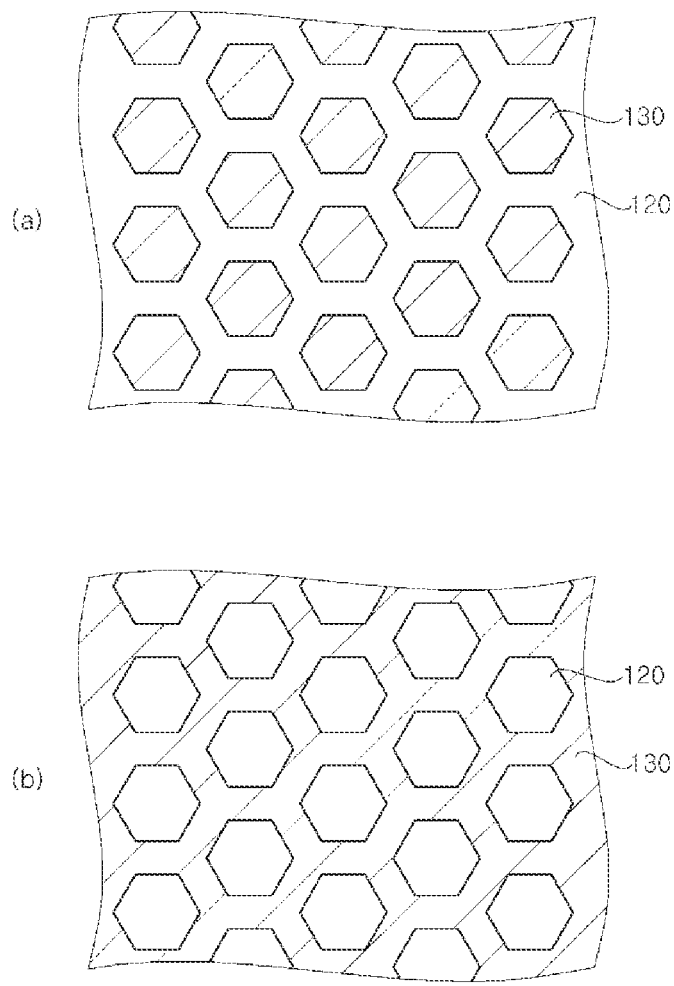

Referring to FIG. 1(b), a mask pattern 130 is formed on the sacrificial layer 120. The mask pattern 130 may be formed of, for example, $SiO_2$. As shown in FIG. 5(a), the mask pattern 130 may have a stripe shape in each mask region. Alternatively, as shown in FIG. 5(b), the mask pattern 130 may have stripe shapes extending in different directions to intersect each other. Alternatively, the mask pattern 130 may be a convex pattern, in which mask regions have a hexagonal shape as shown in FIG. 6(a), or a rhombus shape as shown in FIG. 7(a). Alternatively, the mask pattern 130 may be a concave pattern, in which openings have a hexagonal shape as shown in FIG. 6(b), or a rhombus shape as shown in FIG. 7(b). The mask pattern 130 may be a convex pattern in which the mask regions have a circular shape, or a concave pattern in which the openings have a circular shape.

Referring to FIG. 1(c), micro pores 150 are formed in the sacrificial layer 120 by partially etching the sacrificial layer 120 through electrochemical etching (ECE).

For electrochemical etching, the growth substrate 110 having the sacrificial layer 120 thereon is dipped together with a negative electrode (for example, a Pt electrode) into an ECE solution. Then, a positive voltage is applied to the sacrificial layer 120 and a negative voltage is applied to the negative electrode. The size of the micro pores 150 may be adjusted by adjusting the mole concentration of the ECE solution, process time, and the applied voltage.

The ECE solution may be an electrolyte solution, for example, an electrolyte solution containing oxalic acid, HF or NaOH.

In this embodiment, the sacrificial layer 120 may be partially etched in a first stage of electrochemical etching (ECE), in which a constant voltage, for example, a voltage ranging from 10V to 60V, is continuously applied. However, the present invention is not limited thereto. For example, the sacrificial layer 120 may be partially etched by two-stage electrochemical etching (ECE), in which a relatively low voltage is initially applied and a relatively high voltage is then applied. FIG. 1(c) shows micro pores 152, 154 formed by two-stage electrochemical etching, wherein the micro pores 152 having a relatively small size are formed in the first stage, in which a relatively low voltage is applied, and the micro pores 154 having a relatively large size are formed in the second stage, in which a relatively high voltage is applied. For example, electrochemical etching is performed using a 0.3M oxalic acid solution at 20° C. by applying a voltage of 8~9V in the first stage and a voltage of 15~17V in the second stage to the sacrificial layer 120 having an Si doping density of 6E18/cm3.

Through two-stage electrochemical etching, the surface of the sacrificial layer 120 may maintain relatively good crystallinity, and the interior of the sacrificial layer 120 is formed with relatively large micro pores 154, thereby providing advantages for subsequent processes.

Referring to FIG. 1(d), a nitride semiconductor stack structure 200 including a first nitride semiconductor layer 160, an active layer 170 and a second nitride semiconductor layer 180 is grown on the sacrificial layer 120 used as a seed. The nitride semiconductor stack structure 200 covers not only the sacrificial layer 120, but also the mask pattern 130 through lateral growth.

The first nitride semiconductor layer 160 may be a single layer or multiple layers. Such multiple layers include an undoped layer and a doped layer.

On the other hand, during growth of the semiconductor stack structure 200, the micro pores 152, 154 are combined and grown to form voids 150a. The voids 150a are formed to connect adjacent mask regions in the mask pattern 130. In FIG. 1(d), an interface between the sacrificial layer 120 and the first nitride semiconductor layer 160 is illustrated as remaining. However, the voids 150a may form an interface between the sacrificial layer 120 and the first nitride semiconductor layer 160.

Referring to FIG. 2(a), a nitride semiconductor stack structure 200 including a first nitride semiconductor layer 160, an active layer 170 and a second nitride semiconductor layer 180 is grown on the sacrificial layer 120. As described above, during growth of the semiconductor stack structure 200, the voids 150a are formed within the sacrificial layer 120 by micro pores 152, 154 in the sacrificial layer 120. Here, FIG. 2(a) shows the same process as the process shown FIG. 1(d) at a different scale.

The first nitride semiconductor layer 160 may be formed as a nitride semiconductor layer doped with a first conductive type impurity, for example, a III-N based compound semiconductor layer doped with an n-type impurity, such as an (Al, In, Ga)N-based nitride semiconductor layer, and may include a gallium nitride layer. In addition, the first nitride semiconductor layer 160 may include an undoped layer that is not intentionally doped with impurities.

The active layer 170 may be a III-N based compound semiconductor layer, for example, an (Al, Ga, In)N semiconductor layer, and may have a single quantum-well structure or a multi-quantum well structure in which well layers (not shown) and barrier layers (not shown) are alternately stacked one above another.

The second nitride semiconductor layer 180 may be formed as a III-N based compound semiconductor layer doped with a second conductive type impurity, for example, a P-type impurity, such as an (Al, Ga, In)N-based group-III nitride semiconductor layer, and may include, for example, a GaN layer.

Referring to FIG. 2(b), the nitride semiconductor stack structure 200 is subjected to patterning to form device isolation regions 200a. The device isolation regions 200a may be formed by photolithography and etching. The nitride semiconductor stack structure 200 may be divided into individual device regions, that is, a plurality of semiconductor stack structures 200, by the device isolation regions 200a.

As shown, the device isolation regions 200a allow the sacrificial layer 120 and the mask pattern 130 to be exposed.

Referring to FIG. 2(c), a support substrate 210 is attached to the nitride semiconductor stack structures 200. The support substrate 210 may be bonded to the nitride semiconductor stack structures 200 through metal layers 190. The metal layers 190 may include, for example, a reflective metal layer 192, a barrier metal layer 194 and a bonding metal layer 196. The barrier metal layer 194 covers the reflective metal layer 192, and the bonding metal layer 196 surrounds the reflective metal layer 192 and the barrier metal layer 194 to protect these layers from the etching solution. The reflective metal layer 192 is electrically connected to the second nitride semiconductor layer 180.

In this embodiment, although the metal layers 190 are illustrated as being formed after formation of the device isolation regions 200a, the present invention is not limited thereto. In other words, the reflective metal layer 192 and the barrier metal layer 194 may be formed before formation of the device isolation regions 200a. In addition, the bonding metal layer 196 may also be formed before formation of the device isolation regions 200a.

Figure 4:
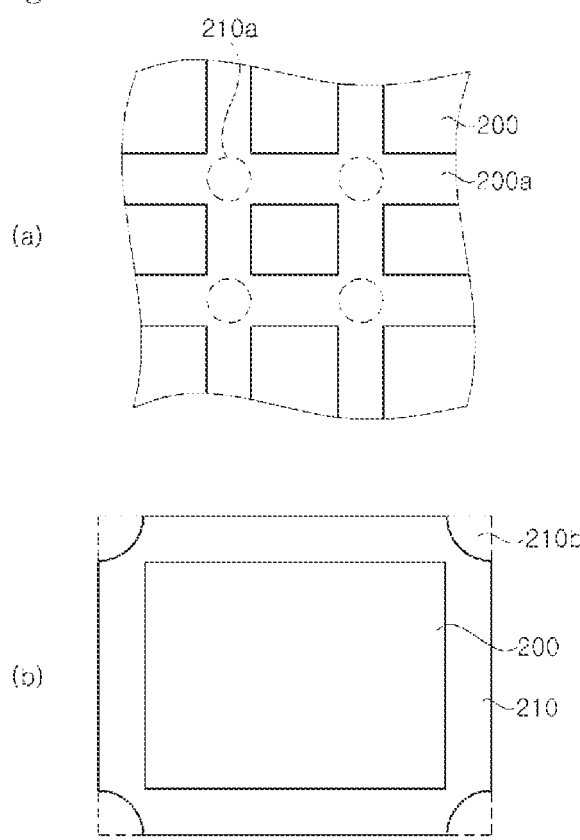
FIG. 4(a) is a schematic plan view of a device isolation region and through-holes of a support substrate.
FIG. 4(b) is a schematic plan view of a support substrate of a final light emitting diode.

As shown, the support substrate 210 may include throughholes 210a. These through-holes 210a may be aligned to be placed inside the device isolation region 200a, as shown in FIG. 4(a). For example, as shown in FIG. 4(a), the throughholes 210a may be respectively placed near four corners of the nitride semiconductor stack structure 200 within a single device region. The through-holes 210a help the etching solution to penetrate the device isolation regions 200a during chemical etching, thereby reducing time for separation of the growth substrate 110 from the nitride semiconductor stack structure 200.

Referring again to FIG. 2(c), the support substrate 210 may be a sapphire substrate, a GaN substrate, a glass substrate, a silicon carbide substrate or silicon substrate, a conductive substrate composed of a metallic material, a circuit substrate such as a PCB and the like, or a ceramic substrate.

In addition, the bonding metal layer (not shown) is formed on the support substrate 210 side to correspond to the bonding metal layer 196, such that the bonding metal layer on the support substrate 210 side is bonded to the bonding metal layer 196 on the nitride semiconductor stack structure 200 side by eutectic bonding, thereby attaching the support substrate 210 to the nitride semiconductor stack structure 200.

Referring to FIG. 2(d), after the support substrate 210 is attached to the semiconductor stack structure 200, the growth substrate 110 is separated from the semiconductor stack structure 200 by chemical etching using the etching solution such as NaOH, BOE or HF. The etching solution etches the mask pattern 130, or etches GaN at the interface between the mask pattern 130 and the nitride semiconductor stack structures 200, thereby separating the growth substrate 110 from the nitride semiconductor stack structure 200. The separated growth substrate 110 may be reused as a growth substrate after surface planarization.

As the mask pattern 130 is removed, a convex-concave structure including recess regions 130a and bump regions 160a is formed on the surface of the nitride semiconductor stack structure 200, particularly, on the surface of the first nitride semiconductor layer 160.

Although chemical etching is performed for separation of the growth substrate 110 in this embodiment, the growth substrate 110 may be separated from the nitride semiconductor stack structure 200 by application of stress. For example, after the plural voids 150a are formed, stress may be applied to the mask pattern 130 to separate the growth substrate 110 from the nitride semiconductor stack structures 200.

FIG. 3(a) shows the separated growth substrate 110 of FIG. 2(d) in an upside-down state. Referring to FIG. 3(a), after the growth substrate 110 is separated from the nitride semiconductor stack structures 200, the surface of the nitride semiconductor stack structures 200 may be washed with chloric acid or the like to remove Ga droplets. In addition, the nitride semiconductor stack structures 200 may be partially removed by dry etching in order to remove a high resistance nitride semiconductor layer remaining on the surface thereof.

Referring to FIG. 3(b), photo-electrochemical etching (PEC) may be performed to form a rough surface (R) on the surface of the nitride semiconductor stack structures 200. The rough surface (R) may be formed on the bottom of the recess regions 130a and on the surface of the bump regions 160a. Together with the recess regions 130a and the bump regions 160a, the rough surface (R) improves light extraction efficiency from the active layer 170.

Next, referring to FIG. 3(c), an electrode 220 is formed on the nitride semiconductor stack structure 200. The electrode 220 may include an electrode pad capable of connecting a wire, and an extension extending from the electrode pad. The electrode 220 is electrically connected to the first nitride semiconductor layer 160. When the support substrate 210 is a conductive type substrate, the support substrate 210 may be electrically connected to the second nitride semiconductor layer 180 to function as an electrode, or a separate electrode pad may be additionally formed under the support substrate 210. When the support substrate 210 is formed of an insulator, the electrode pad may be formed to extend from the metal layers 190.

Before or after forming the electrode 220, an insulating layer (not shown) may be further formed to cover the nitride semiconductor stack structure 200.

Referring to FIG. 3(d), the support substrate 210 is divided into a plurality of regions for individual devices, thereby completing light emitting diodes. The support substrate 210 may be divided into the plural regions by scribing along the device isolation region.

As shown in FIG. 4(b), at four corners of the support substrate 210, each of the through-holes 210a may be divided, thereby forming a depression 210b. In the light emitting diode, the semiconductor stack structure 200 has a narrower width than the support substrate 210 and, particularly, is placed inside the depression 210b.

According to this embodiment, the growth substrate 110 can be separated from the nitride semiconductor stack structure 200 without damage to the nitride semiconductor stack structure 200. In addition, since the growth substrate 110 is separated using the voids 150 formed between the growth substrate 110 and the semiconductor stack structure 200, the growth substrate 110 can be easily separated by application of stress or chemical etching.

In addition, since the through-holes 210a are formed together with the device isolation regions, more rapid infiltration of the etching solution can be achieved, thereby further reducing the process time. Further, the separated growth substrate 110 may be reused as a growth substrate.

Figure 9:
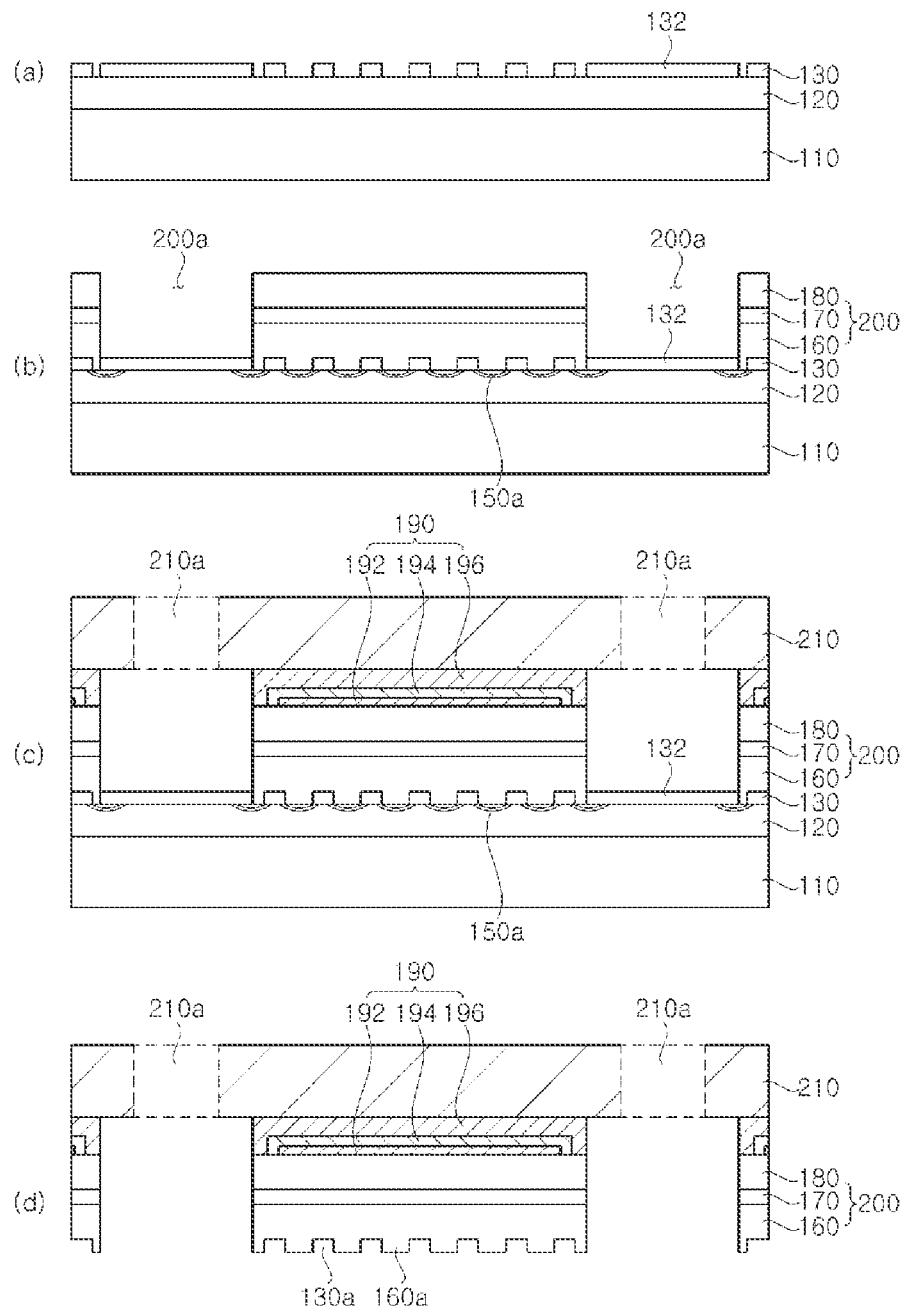

FIG. 8 and FIG. 9 are a plan view and sectional views illustrating a method of separating a growth substrate and a method of fabricating a light emitting diode in accordance with another embodiment of the invention. Here, FIG. 8 and FIG. 9(a) are a plan view and a sectional view showing operation of forming a mask pattern 130 and an isolation mask 132.

Referring to FIG. 8 and FIG. 9(a), a sacrificial layer 120 is formed on a substrate 110, as described in FIG. 1(a). In addition, as described in FIG. 1(b), a mask pattern 130 is formed on the sacrificial layer 120. In this embodiment, however, the mask pattern 130 is formed in a state of being divided into a plurality of regions for individual devices. For example, the mask pattern 130 may be divided into the plural regions through an isolation mask 132. The isolation mask 132 may be formed of the same material, for example, $SiO_2$, and by the same process as the material and process for the mask pattern 130. However, the present invention is not limited thereto. That is, the isolation mask 132 may be formed of a different type of material capable of blocking growth of the nitride semiconductor layer.

The isolation mask 132 is formed corresponding to device isolation regions 200a, and each mask pattern 130 is formed corresponding to a device region.

Herein, the mask pattern 130 may have a stripe shape, a convex pattern, or a concave pattern, as described in FIG. 1(b) and FIG. 5 to FIG. 7.

Referring to FIG. 9(b), as described in FIG. 1(c) and FIG. 1(d), the sacrificial layer 120 exposed through the openings of the mask pattern 130 is partially etched by electrochemical etching (ECE), and a semiconductor stack structure 200 is grown on the sacrificial layer 120 acting as a seed. In this embodiment, since growth of the nitride semiconductor stack structure 200 is blocked by the isolation mask 132, device isolation regions 200a are formed on the isolation mask 132 by the process of growing the nitride semiconductor stack structure 200, so that the nitride semiconductor stack structure 200 is divided into a plurality of device regions. In other words, the device isolation regions 200a are self-aligned by the process of growing the semiconductor stack structure 200, and a separate patterning process of forming the device isolation regions is omitted.

Referring to FIG. 9(c), as described in FIG. 2(c), a support substrate 210 is attached to the semiconductor stack structure 200. The process of attaching the support substrate 210 thereto is the same as in the aforementioned embodiment, and thus, a detailed description thereof will be omitted.

Referring to FIG. 9(d), as described in FIG. 2(d), the growth substrate 110 is separated from the semiconductor stack structure 200 by chemical etching using the etching solution such as NaOH, BOE or HF. The etching solution etches the isolation mask 132 and the mask pattern 130, or etches GaN at an interface between the mask pattern 130 and the nitride semiconductor stack structures 200, thereby separating the growth substrate 110 from the nitride semiconductor stack structure 200. The separated growth substrate 110 may be reused as a growth substrate after surface planarization.

As the mask pattern 130 is removed, a convex-concave structure including recess regions 130a and bump regions 160a is formed on the surface of the nitride semiconductor stack structure 200, particularly, on the surface of the first nitride semiconductor layer 160.

Next, a light emitting diode may be fabricated as shown in FIG. 3(d) through the process as described in FIG. 3.

Although chemical etching is performed for separation of the growth substrate 110 in this embodiment, the growth substrate 110 may be separated from the nitride semiconductor stack structure 200 by application of stress. For example, after voids 150a are formed, stress may be applied to the mask pattern 130 to separate the growth substrate 110 from the nitride semiconductor stack structure 200.

Although the metal layers 190 are formed by photolithography and etching after growth of the nitride semiconductor stack structure 200 in the above embodiment, the device isolation regions 200a can be automatically formed during growth of the semiconductor stack structure 200 in this embodiment, thereby enabling elimination of photolithography and etching.

Figure 10:
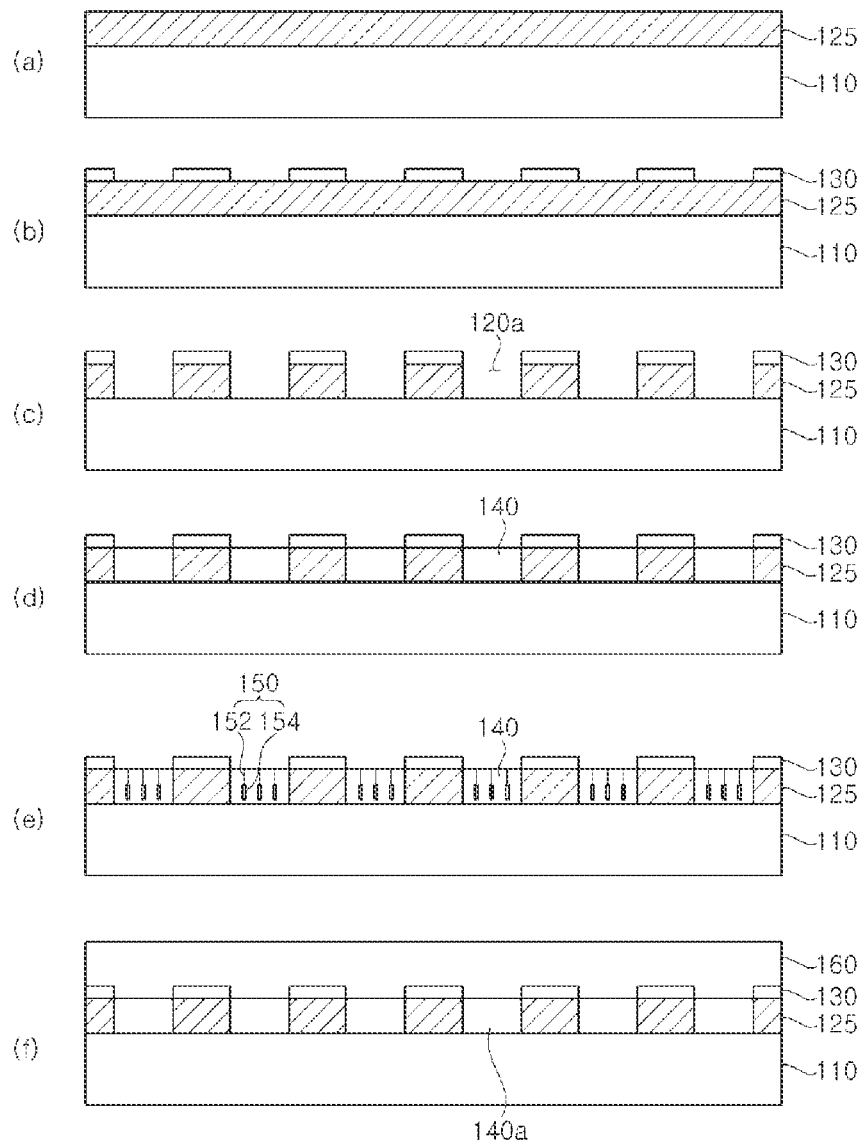
FIG. 10 and FIG. 11 shows sectional views explaining a method of separating a growth substrate and a method of fabricating a light emitting diode in accordance with a further embodiment of the present invention.
Figure 11:
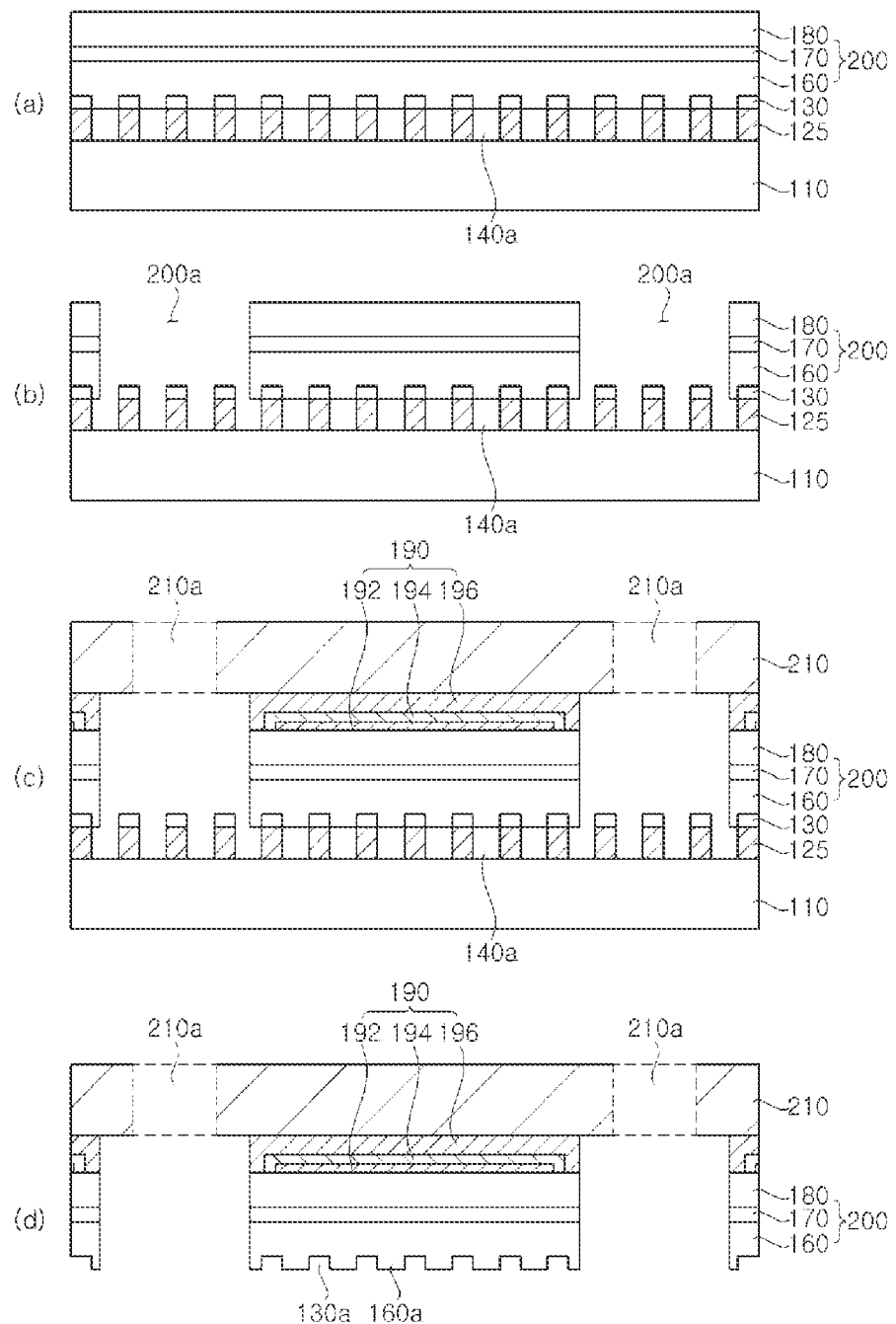

FIG. 10 and FIG. 11 show sectional views illustrating a method of separating a growth substrate and a method of fabricating a light emitting diode in accordance with a further embodiment of the present invention.

First, referring to FIG. 10(a), a growth substrate 110 is prepared. The growth substrate 110 is the same as the growth substrate described with reference to FIG. 1(a), and a detailed description thereof will be omitted.

A lower nitride layer 125 is formed on the growth substrate 110. The lower nitride layer 125 may be formed on the growth substrate 110 by, for example, metal-organic chemical vapor deposition (MOCVD) or molecular beam epitaxy (MBE). The lower nitride layer 125 may be a gallium nitride layer doped with a relatively low density of impurities, for example, a Si-doped GaN layer, which is doped with $3E18/cm^3$ or less of Si, preferably $1E18/cm^3$ or less of Si. Nitride semiconductor layers described below may also be grown together with the lower nitride layer 125 by MOCVD or MBE, and a detailed description thereof will be omitted.

Referring to FIG. 10(b), a mask pattern 130 is formed on the lower nitride layer 125. As described in FIG. 1(b), the mask pattern 130 may be formed as a concave pattern or as a convex pattern, as described in FIG. 1(b). Specifically, in the mask pattern 130, each mask may have a stripe shape, a rhombus shape, a hexagonal shape or a circular shape. Alternatively, the masks of the mask pattern 130 may be continuous, and openings surrounded by the masks may have a rhombus shape, a hexagonal shape, or a circular shape.

Referring to FIG. 10(c), the lower nitride layer 125 is subjected to etching through the mask pattern 130 used as an etching mask. The lower nitride layer 125 may be subjected to dry etching, for example, reactive ion etching. A recess 125a is formed by etching the lower nitride layer 125.

Referring to FIG. 10(d), a sacrificial layer 140 of a nitride semiconductor is formed within the recess 125a. The sacrificial layer 140 may be doped with a higher density of impurities, for example, Si, than the lower nitride layer 125. For example, the sacrificial layer 140 may have a Si doping density of $3E18/cm^3$ or more.

Referring to FIG. 10(e), micro pores 150 are formed in the sacrificial layer 140 by partially etching the sacrificial layer 140 through electrochemical etching (ECE).

For electrochemical etching, the growth substrate 110 having the sacrificial layer 140 thereon is dipped, together with a negative electrode (for example, Pt electrode), in an ECE solution. Then, a positive voltage is applied to the sacrificial layer 140 and a negative voltage is applied to the negative electrode. The size of the micro pores 150 may be adjusted by adjusting the mole concentration of the ECE solution, process time, and the applied voltage.

The ECE solution may be an electrolyte solution, for example, an electrolyte solution containing oxalic acid, HF or NaOH.

In this embodiment, the sacrificial layer 140 may be partially etched in a first stage of electrochemical etching (ECE), in which a constant voltage, for example, a voltage ranging from 10V to 60V, is continuously applied. However, the present invention is not limited thereto. For example, the sacrificial layer 120 may be partially etched by two-stage electrochemical etching (ECE), in which a relatively low voltage is initially applied and a relatively high voltage is then applied. FIG. 10(e) shows micro pores 152, 154 formed by two-stage electrochemical etching, wherein micro pores 152 having a relatively small size are formed in the first stage, in which a relatively low voltage is applied, and micro pores 154 having a relatively large size are formed in the second stage, in which a relatively high voltage is applied. For example, electrochemical etching is performed using a 0.3M oxalic acid solution at 20° C. by applying a voltage of 8~9V in the first stage and a voltage of 15~-17V in the second stage to the sacrificial layer 140 having an Si doping density of 6E18/cm3.

Through two-stage electrochemical etching, the surface of the sacrificial layer 140 may maintain relatively good crystallinity, and the interior of the sacrificial layer 140 is formed with relatively large micro pores 154, thereby providing advantages for subsequent processes.

During electrochemical etching, the lower nitride layer 125 is not substantially etched due to relatively low density of impurities.

Referring to FIG. 10(f), a first nitride semiconductor layer 160 is grown on the sacrificial layer 140 used as a seed. The first nitride semiconductor layer 160 covers not only the sacrificial layer 140, but also the mask pattern 130.

The first nitride semiconductor layer 160 may be a single layer or multiple layers. Such multiple layers include an undoped layer and a doped layer.

On the other hand, during growth of the first nitride semiconductor layer 160, the micro pores 152, 154 are combined and grown to form voids 140a in the recess 125a of the lower nitride layer 125. The growth substrate 110 may be separated from the nitride semiconductor stack structure using the voids 140a through application of stress or chemical etching using the etching solution. For example, after continuously growing nitride semiconductor layers for fabrication of light emitting diodes on the first nitride semiconductor layer 160, a support substrate is attached to the semiconductor layers, and the growth substrate is separated by applying stress to the lower nitride layer 125 and the mask pattern 130. A method of separating the growth substrate 110 through chemical etching will be described with reference to FIG. 11. In FIG. 11, although the distance between the mask patterns 130 is the same as that of FIG. 10, the mask patterns 130 are shown as being more densely arranged for better understanding of the invention.

Referring to FIG. 11(a), a nitride semiconductor stack structure 200 including a first nitride semiconductor layer 160, an active layer 170 and a second nitride semiconductor layer 180 is grown on the sacrificial layer 140. As described above, during growth of the semiconductor stack structure 200, voids 150a are formed within the recess 125a of the lower nitride layer 125 by micro pores 152, 154 in the sacrificial layer 120.

The first nitride semiconductor layer 160, the active layer 170 and the second nitride semiconductor layer 180 are the same as those described with reference to FIG. 2(a), and repeated descriptions thereof will be omitted.

Referring to FIG. 11(b), as described in FIG. 2(b), device isolation regions 200a are formed by patterning the nitride semiconductor stack structure 200.

Referring to FIG. 11(c), a support substrate 210 is attached to the nitride semiconductor stack structures 200, as described in FIG. 2(c).

Although the metal layers 190 are described as being formed after formation of the device isolation regions 200a in this embodiment, the present invention is not limited thereto. That is, a reflective metal layer 192 and a barrier metal layer 194 may be formed before the device isolation regions 200a are formed. In addition, the bonding metal layer 196 may also be formed before the device isolation regions 200a are formed.

Further, as shown, the support substrate 210 may be formed with through-holes 210a. The through-holes 210a are the same as those described in FIG. 4(a), and a detailed description thereof will be omitted. The through-holes 210a help the etching solution to penetrate the device isolation regions 200a during chemical etching, thereby reducing time required for separation of the growth substrate 110 from the nitride semiconductor stack structure 200.

Referring to FIG. 11(d), after the support substrate 210 is attached to the semiconductor stack structure 200, the growth substrate 110 is separated from the semiconductor stack structure 200 by chemical etching using the etching solution such as NaOH, BOE or HF, as described in FIG. 2(d). The etching solution etches the mask pattern 130, or etches GaN at the interface between the mask pattern 130 and the nitride semiconductor stack structures 200, thereby separating the growth substrate 110 from the nitride semiconductor stack structure 200. The separated growth substrate 110 may be reused as a growth substrate after surface planarization.

As the mask pattern 130 is removed, recess regions 130a and bump regions 160a are formed on the surface of the nitride semiconductor stack structure 200, particularly, on the surface of the first nitride semiconductor layer 160.

Although chemical etching is performed for separation of the growth substrate 110 in this embodiment, the growth substrate 110 may be separated from the nitride semiconductor stack structure 200 by application of stress. For example, after the plural voids 150a are formed, stress may be applied to the mask pattern 130 to separate the growth substrate 110 from the nitride semiconductor stack structures 200.

Then, light emitting diodes are fabricated through processes as described with reference to FIG. 3(a) to FIG. 3(d), and repeated descriptions thereof will be omitted. In addition, as shown in FIG. 4(b), at four corners of the support substrate 210, each of the through-holes 210a is divided, thereby forming a depression 210b.

According to the present embodiment, the growth substrate 110 can be separated from the nitride semiconductor stack structure 200 without damage to the nitride semiconductor stack structures 200. In addition, since the growth substrate 110 is separated via the voids 140a formed between the growth substrate 110 and the semiconductor stack structure 200, the growth substrate 110 can be easily separated by application of stress or chemical etching. Further, according to this embodiment, the size of the voids 140a can be determined by adjusting the thickness of the lower nitride layer 125, whereby it is possible to form relatively large voids 140a. As a result, it is possible to reduce process time by promoting infiltration of the etching solution during chemical etching. Further, since the through-holes 210a are formed together with the device isolation regions, more rapid infiltration of the etching solution can be achieved, thereby further reducing process time. Further, the separated growth substrate 110 may be reused as a growth substrate.

Figure 12:
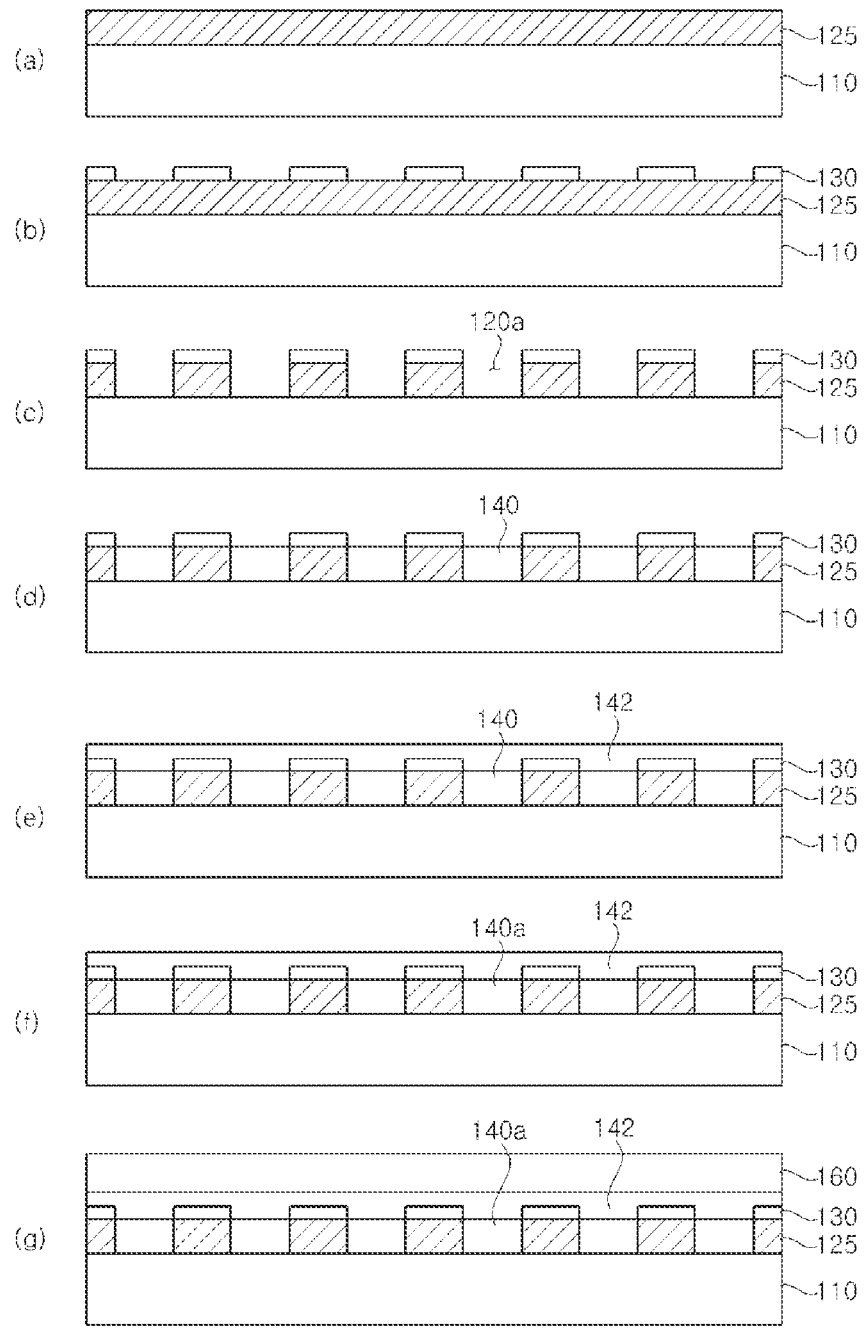
FIG. 12 shows sectional views illustrating a method of separating a growth substrate and a method of fabricating a light emitting diode in accordance with yet another embodiment of the present invention.

FIG. 12 shows sectional views illustrating a method of separating a growth substrate and a method of fabricating a light emitting diode in accordance with yet another embodiment of the present invention.

FIG. 12(a) to FIG. 12(d) show the same processes as those shown in FIG. 10(a) to FIG. 10(d), and repeated descriptions thereof will be omitted.

Referring to FIG. 12(e), an upper nitride layer 142 is formed on a sacrificial layer 140. The upper nitride layer 142 may be doped with a lower density of impurities, for example, Si, than the sacrificial layer 140, or may be formed without impurity doping. For example, the upper nitride layer 142 may be formed without impurity doping, or may be a gallium nitride layer, for example, a Si-doped GaN layer doped with $3E18/cm^3$ or less of Si, preferably $1E18/cm^3$ or less of Si.

Referring to FIG. 12(f), voids 140a are formed by etching the sacrificial layer 140 through electrochemical etching (ECE).

As described in FIG. 10(e), for electrochemical etching, the growth substrate 110 having the sacrificial layer 140 thereon is dipped together with a negative electrode (for example, Pt electrode) in an ECE solution, and a positive voltage is applied to the sacrificial layer 140 and a negative voltage is applied to the negative electrode.

Figure 13:
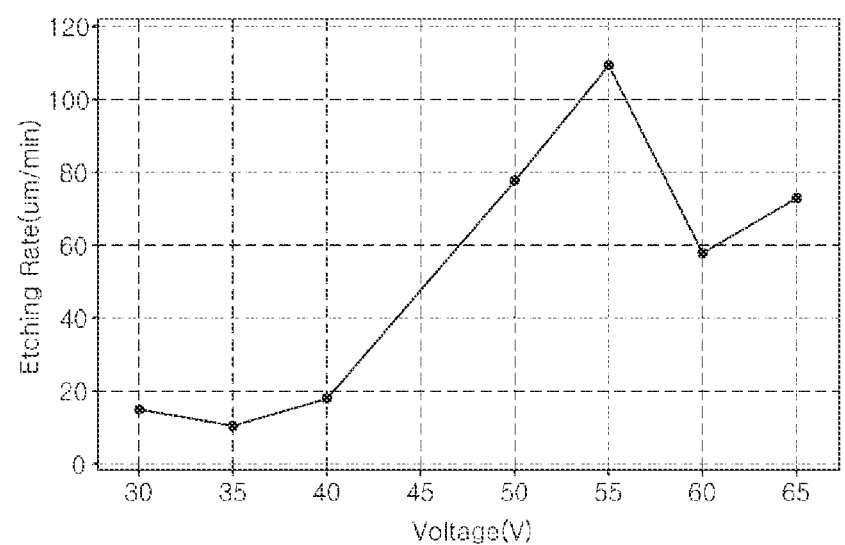
FIG. 13 is a graph depicting an etching rate of a high density doping layer according to voltage in electrochemical etching.

In this embodiment, electrochemical etching is performed at a relatively high voltage. FIG. 13 is a graph depicting an etching rate of a high density doping layer according to voltage in electrochemical etching. Here, the oxalic acid solution had a mole concentration of 0.3M, and a sample was prepared by forming a high density GaN layer having a Si doping density of $6E18/cm^3$ on the growth substrate, followed by forming an undoped GaN layer thereon. After electrochemical etching of the high density GaN layer while changing voltage in units of 5V, the thickness of the etched high density GaN layer was measured to obtain the etching rate according to voltage. As can be seen from FIG. 13, when the voltage was in the range from 30V to 40V, there was no significant variation in etching rate. However, as the voltage exceeded 40V, the etching rate was rapidly increased and reached a maximum value at a voltage of 55V. When electrochemical etching was performed at a voltage ranging from about 50V to about 65V, the sacrificial layer 140 was etched at a high etching rate. Accordingly, when electrochemical etching is performed at a relatively high voltage, voids 140a are formed instead of the micro pores in an etching process.

Then, referring to FIG. 12(g), a first nitride semiconductor layer 160 may be grown on the upper nitride layer 142. Next, the growth substrate 110 is separated from the nitride semiconductor stack structure 200 through the processes as described in FIG. 2 and FIG. 3, thereby forming a light emitting diode as shown in FIG. 3(d). In this embodiment, after the growth substrate 110 is separated, the upper nitride layer 142 may be removed by dry etching or the like.

According to this embodiment, since the first nitride semiconductor layer 160 is grown on the upper nitride layer 142 by electrochemical etching, it is possible to improve crystallinity of the nitride semiconductor stack structure 200 as compared with the aforementioned embodiments.

Figure 14:
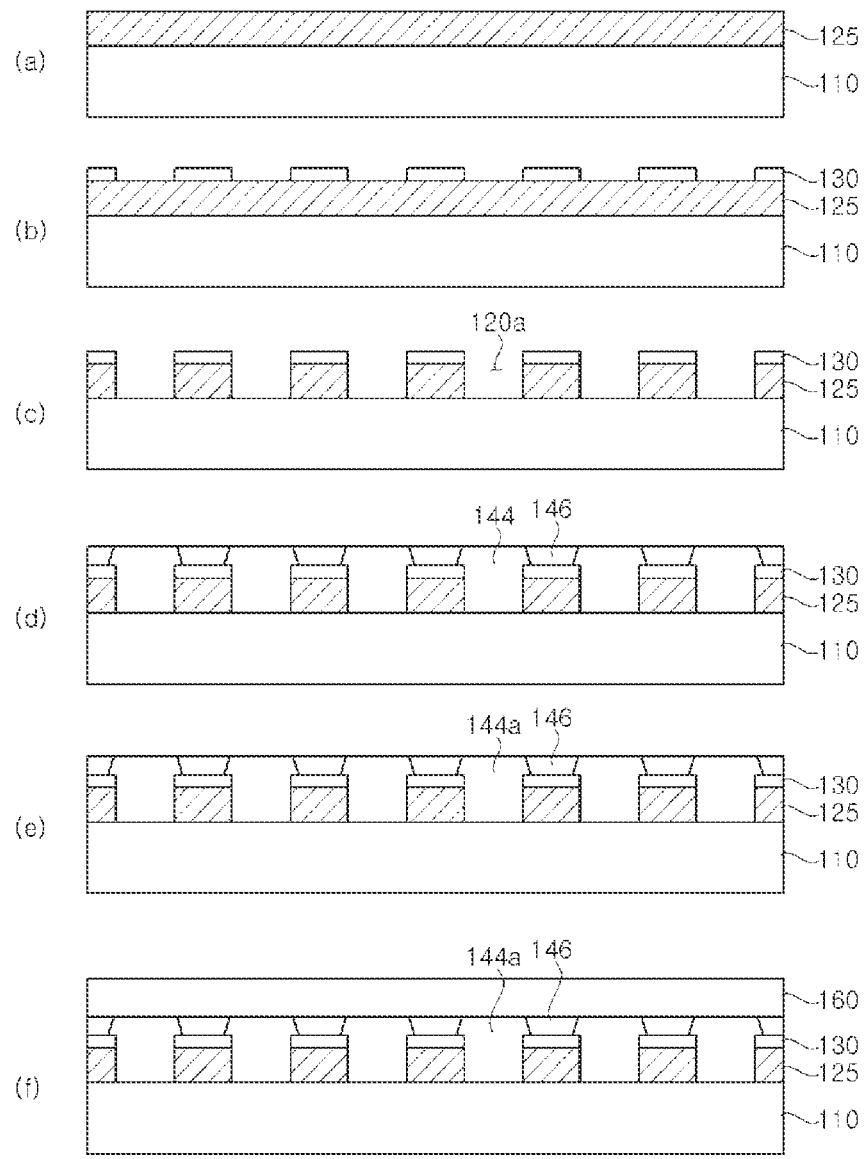
FIG. 14 shows sectional views illustrating a method of separating a growth substrate and a method of fabricating a light emitting diode in accordance with yet another embodiment of the present invention.

FIG. 14 shows sectional views illustrating a method of separating a growth substrate and a method of fabricating a light emitting diode in accordance with yet another embodiment of the present invention.

The method of fabricating a light emitting diode according to this embodiment is substantially similar to the method described with reference to FIG. 12. However, the sacrificial layer 140 is completely covered by the upper nitride layer 142 in the embodiment shown in in FIG. 12, whereas a sacrificial layer 144 is exposed instead of being covered by an upper nitride layer 146 in the method according to the present embodiment.

First, the processes of FIG. 14(a) to FIG. 14(c) are the same as those shown in FIG. 10(a) to FIG. 10(c), and detailed descriptions thereof will be omitted.

Referring to FIG. 14(d), the sacrificial layer 144 is formed to partially cover each mask in the mask pattern 130. The sacrificial layer 144 fills a recess 125a formed in a lower nitride layer 125, and is grown over the mask pattern 130 to partially cover the mask pattern 130. In the mask pattern 130, a central region of each mask is exposed instead of being covered by the sacrificial layer 144.

The upper nitride layer 146 is formed to cover the mask pattern 130 while filling a depression in the sacrificial layer 144. An upper surface of the sacrificial layer 144 is exposed to the outside instead of being covered by the upper nitride layer 146.

Referring to FIG. 14(e), voids 144a are formed by electrochemical etching of the sacrificial layer 144. Electrochemical etching may be performed at high voltage as described with reference to FIG. 12(f).

Referring to FIG. 14(f), a first nitride semiconductor layer 160 is formed on the upper nitride layer 146 used as a seed. Then, the growth substrate 110 is separated from the nitride semiconductor stack structure 200 through the processes described in FIG. 2 and FIG. 3, thereby forming a light emitting diode as shown in FIG. 3(d). In this embodiment, after the growth substrate 110 is separated, the upper nitride layer 146 may be removed by dry etching or the like.

According to this embodiment, since the first nitride semiconductor layer 160 is grown on the undamaged upper nitride layer 146 used as a seed layer by electrochemical etching, it is possible to improve crystallinity of the nitride semiconductor stack structure 200.

Figure 15:
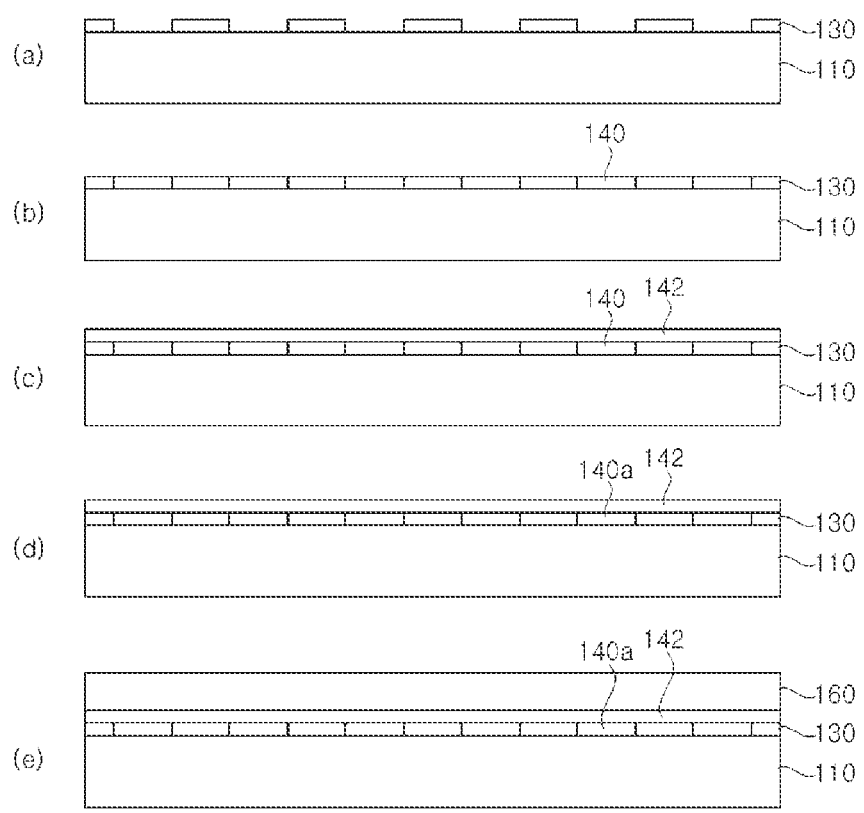
FIG. 15 is sectional views illustrating a method of separating a growth substrate and a method of fabricating a light emitting diode in accordance with yet another embodiment of the present invention.

FIG. 15 is sectional views illustrating a method of separating a growth substrate and a method of fabricating a light emitting diode in accordance with yet another embodiment of the present invention.

In the above embodiments, after the growth substrate 110 is grown on the lower nitride layer 125, the mask pattern 130 is formed on the lower nitride layer 125. In this embodiment, however, the lower nitride layer 125 is omitted, and the mask pattern is directly formed on the growth substrate 110.

Referring to FIG. 15(a), the mask pattern 130 is formed on the growth substrate 110. The mask pattern 130 is the same as that described with reference to FIG. 10(b), and a detailed description thereof will be omitted herein. The growth substrate 110 is partially exposed through the mask pattern 130. In addition, the substrate 110 may be subjected to etching using the mask pattern 130 as an etching mask.

Referring to FIG. 15(b), a sacrificial layer 140 is formed on the growth substrate 110. The sacrificial layer 140 fills recesses defined by the mask pattern 130. In addition, the sacrificial layer 140 may partially cover the mask pattern 130.

Referring to FIG. 15(c), an upper nitride layer 142 is formed to cover the sacrificial layer 140 and the mask pattern 130. The upper nitride layer 142 is the same as the upper nitride layer 142 described in FIG. 12(e), and a detailed description thereof will be omitted herein.

Referring to FIG. 15(d), voids 140a are formed by electrochemical etching of the sacrificial layer 140. Electrochemical etching is the same as that described in FIG. 12(f), and a detailed description thereof will be omitted herein.

Referring to FIG. 15(e), a first nitride semiconductor layer 160 is formed on the upper nitride layer 142. Then, a light emitting diode similar to the light emitting diode as shown in FIG. 3(d) is fabricated through the processes described in FIG. 2 and FIG. 3. In addition, the upper nitride layer 142 may be removed by dry etching or the like after the growth substrate 110 is separated.

In this embodiment, since the lower nitride layer 125 can be omitted, further process simplification is possible.

In this embodiment, although the upper nitride layer 142 is illustrated as completely covering the sacrificial layer 140, the sacrificial layer 144 may be formed to partially cover each of the masks in the mask pattern 130, and the upper nitride layer 146 may be formed to cover the exposed portions of the mask pattern 130 while allowing the sacrificial layer 144 to be exposed therethrough, as described with reference to FIG. 14(d).

Further, in this embodiment, the upper nitride layer 142 may be omitted, and, as described in FIG. 10(e), micro pores 152, 154 may be formed in the sacrificial layer 140 by electrochemical etching. Then, the first nitride semiconductor layer 160 is formed on the sacrificial layer 140 used as a seed, and voids 140a may be formed during formation of the semiconductor stack structure 200.

Although some embodiments have been described herein, those skilled in the art will understand that the present invention is not limited to the above embodiments and features thereof, and that various modifications, variations, and alterations can be made without departing from the spirit and scope of the invention.

The invention claimed is:

1. A method of separating a growth substrate, comprising:
preparing a growth substrate;
forming a sacrificial layer over the growth substrate;
forming a mask pattern over the sacrificial layer, wherein the mask pattern exposes at least a portion of the sacrificial layer;
etching at least a portion of the sacrificial layer via an electrochemical etching (ECE);
forming a plurality of nitride semiconductor stack structures over the sacrificial layer to cover at least a portion of the mask pattern, the nitride semiconductor stack structures being isolated from one another by device isolation regions;
forming a support substrate over the plurality of nitride semiconductor stack structures, the support substrate having a plurality of through-holes connected to the device isolation regions; and
separating the growth substrate from the nitride semiconductor stack structures.

2. The method of claim 1, wherein the etching of the at least a portion of the sacrificial layer includes applying a voltage in a first stage and another voltage in a second stage, wherein the voltage applied in the first stage is lower than the other voltage applied in the second stage.

3. The method of claim 1, wherein the forming of the plurality of nitride semiconductor stack structures includes growing an integrated nitride semiconductor stack structure using the sacrificial layer as a seed to cover the mask pattern.

4. The method of claim 1, wherein the forming of the plurality of nitride semiconductor stack structures includes forming voids in the sacrificial layer.

5. The method of claim 1, wherein the forming of the plurality of nitride semiconductor stack structures comprises patterning the nitride semiconductor stack structures to form the device isolation regions.

6. The method of claim 1, further comprising:
forming an isolation mask dividing the mask pattern into a plurality of regions before growth of the nitride semiconductor stack structures,
wherein the nitride semiconductor stack structures are grown to be isolated from each other on the isolation mask to form the device isolation regions.

7. The method of claim 1, wherein each of the plurality of nitride semiconductor stack structures has a rectangular shape having four corners, and the through-holes of the support substrate are aligned adjacent the four corners of each of the nitride semiconductor stack structures.

8. The method of claim 1, wherein the through-holes of the support substrate have a size to be placed within the device isolation regions.

9. The method of claim 1, wherein the separating of the growth substrate includes applying stress or performing chemical etching.

10. The method of claim 9, wherein the chemical etching is performed using NaOH, BOE or HF.

11. The method of claim 1, wherein the mask pattern has a convex pattern in which mask regions defined by the mask pattern have a stripe shape, a rhombus shape, or a hexagonal shape.

12. The method of claim 1, wherein the mask pattern has a concave pattern in which openings defined by the mask pattern have a rhombus shape or a hexagonal shape.

13. The method of claim 1, further comprising:
forming a reflective metal layer, a barrier metal layer and a bonding metal layer over the nitride semiconductor stack structures, before the forming of the support substrate.

14. The method of claim 13, wherein the bonding metal layer surrounds the reflective metal layer and the barrier metal layer.

15. A method of fabricating a light emitting diode, comprising:
- preparing a growth substrate including a pattern;
- forming a sacrificial layer and a mask pattern over the growth substrate such that at least a portion of the sacrificial layer is exposed through the mask pattern;
- etching at least a portion of the sacrificial layer to form a void;
- forming a nitride semiconductor stack structure covering the mask pattern; and
- separating the growth substrate from the nitride semiconductor stack structure.

* * * * *